US008956500B2

(12) United States Patent
Yuen et al.

(10) Patent No.: US 8,956,500 B2
(45) Date of Patent: Feb. 17, 2015

(54) METHODS TO ELIMINATE "M-SHAPE" ETCH RATE PROFILE IN INDUCTIVELY COUPLED PLASMA REACTOR

(75) Inventors: Stephen Yuen, Santa Clara, CA (US);
Kyeong-Tae Lee, San Jose, CA (US);
Valentin Todorow, Palo Alto, CA (US);
Tae Won Kim, San Jose, CA (US);
Anisul Khan, Santa Clara, CA (US);
Shashank Deshmukh, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1059 days.

(21) Appl. No.: 11/739,428

(22) Filed: Apr. 24, 2007

(65) Prior Publication Data

US 2008/0264904 A1  Oct. 30, 2008

(51) Int. Cl.
C23C 16/00 (2006.01)
H01L 21/306 (2006.01)
H01J 37/32 (2006.01)

(52) U.S. Cl.
CPC ..................................... *H01J 37/321* (2013.01)
USPC .............. 156/345.48; 118/723 I; 118/723 AN

(58) Field of Classification Search
CPC ................ H01J 37/321; H01J 37/3211; H01J 37/32119; H01J 27/32128; H01J 37/32137; H01J 37/32146; H01J 37/32155; H01J 37/32165; H01J 37/32174; H01J 37/32183
USPC ....... 118/723 I, 723 IR, 723 AN; 156/345.48, 156/345.49; 315/111.51
See application file for complete search history.

(56) References Cited

U.S. PATENT DOCUMENTS

| 5,571,366 | A | * | 11/1996 | Ishii et al. ................. 156/345.26 |
| 5,777,289 | A | * | 7/1998 | Hanawa et al. .......... 219/121.43 |
| 5,919,382 | A | | 7/1999 | Qian et al. |
| 6,165,311 | A | | 12/2000 | Collins et al. |
| 6,270,617 | B1 | | 8/2001 | Yin et al. |
| 6,320,320 | B1 | * | 11/2001 | Bailey et al. ............. 315/111.51 |
| 6,462,483 | B1 | * | 10/2002 | Jeng et al. ................. 315/111.51 |
| 6,617,794 | B2 | * | 9/2003 | Barnes et al. ............. 315/111.21 |
| 6,685,798 | B1 | * | 2/2004 | Holland et al. .......... 156/345.48 |
| 6,694,915 | B1 | | 2/2004 | Holland et al. |
| 2002/0020499 | A1 | | 2/2002 | Collins et al. |
| 2004/0056602 | A1 | * | 3/2004 | Yang et al. ................ 315/111.21 |
| 2005/0103445 | A1 | * | 5/2005 | Brcka et al. ............... 156/345.48 |

(Continued)

FOREIGN PATENT DOCUMENTS

| EP | 0759632 | 2/1997 |
| EP | 0818016 | 12/1997 |
| EP | 0833367 | 4/1998 |

(Continued)

*Primary Examiner* — Luz Alejandro Mulero
(74) *Attorney, Agent, or Firm* — Blakely, Sokoloff, Taylor & Zafman LLP

(57) ABSTRACT

An inductively-coupled plasma processing chamber has a chamber with a ceiling. A first and second antenna are placed adjacent to the ceiling. The first antenna is concentric to the second antenna. A plasma source power supply is coupled to the first and second antenna. The plasma source power supply generates a first RF power to the first antenna, and a second RF power to the second antenna. A substrate support disposed within the chamber. The size of the first antenna and a distance between the substrate support are such that the etch rate of the substrate on the substrate support is substantially uniform.

7 Claims, 6 Drawing Sheets

(56) References Cited

U.S. PATENT DOCUMENTS

| | | |
|---|---|---|
| 2008/0115728 A1 | 5/2008 | Matsuda et al. |
| 2008/0264904 A1 | 10/2008 | Yuen et al. |

FOREIGN PATENT DOCUMENTS

| | | |
|---|---|---|
| EP | 0838843 | 4/1998 |
| JP | 08-078191 | 3/1996 |
| JP | 08148476 | 6/1996 |
| JP | 10-092598 | 4/1998 |
| JP | 2004-509429 | 3/2004 |
| KR | 10-0474748 | 9/1997 |
| KR | 10-0474748 | 4/2005 |
| TW | 329018 | 4/1998 |
| WO | WO 00/00993 | 1/2000 |
| WO | WO 02/05308 A2 | 1/2002 |
| WO | WO 2006/092997 A1 | 9/2006 |

* cited by examiner

METHODS TO ELIMINATE "M-SHAPE" ETCH RATE PROFILE IN INDUCTIVELY COUPLED PLASMA REACTOR

TECHNICAL FIELD

This invention relates to a substrate processing chamber. More particularly, the invention relates to methods for improving etch rate uniformity in an inductively coupled plasma reactor.

BACKGROUND

Plasma reactors used to fabricate semiconductor microelectronic circuits can employ RF inductively coupled fields to maintain a plasma formed from a processing gas. Such a plasma is useful in performing etch and deposition processes. Typically, a high frequency RF source power signal is applied to a coil antenna near the reactor chamber ceiling. A semiconductor wafer or workpiece support on a pedestal within the chamber has a bias RF signal applied to it. The power of the signal applied to the coil antenna primarily determines the plasma ion density within the chamber, while the power of the bias signal applied to the wafer determines the ion energy at the wafer surface. One problem with such a coil antenna is that there is a relatively large voltage drop across the coil antenna, which can induce unfavorable effects in the plasma. This effect becomes more acute as the frequency of the source power signal applied to the coil antenna is increased, since the reactance of the coil antenna is proportional to frequency. In some reactors, this problem is addressed by limiting the frequency to a low range such as about 2 MHz. Unfortunately, at such lower frequencies, the coupling of RF power to the plasma can be less efficient. It is often easier to achieve a stable high density plasma discharge at frequencies in the range of 10 MHz to 20 MHz. Another disadvantage of operating at the lower frequency range (e.g., 2 MHz) is that the component size of such elements as the impedance match network are much larger and therefore more cumbersome and costly.

Another problem with coil antennas is that efficient inductive coupling to the plasma is generally achieved by increasing the number of turns in the coil which creates a larger the magnetic flux density. This increases the inductive reactance of the coil, and, since the circuit resistance (consisting primarily of the plasma resistance) remains constant, the circuit Q (the ratio of the circuit reactance to resistance) increases. This in turn leads to instabilities and difficulties in maintaining an impedance match over varying chamber conditions. Instabilities arise particularly where the coil inductance is sufficiently great so that, in combination with stray capacitance, self-resonance occurs near the frequency of the RF signal applied to the coil. Thus, the inductance of the coil must be limited in order to avoid these latter problems.

One limitation of coil antennas overlying the chamber ceiling (both conventional as well as the interleaved type) is that the mutual inductance between adjacent conductors in the antenna is generally in a horizontal direction—generally orthogonal from the vertical direction in which RF power must be inductively coupled to the plasma. This is one important factor that limits the spatial control of the power deposition to the plasma. It is a goal of the present invention to overcome this limitation in the spatial control of the inductive coupling.

Typically with "inner" and "outer" coil antennas, they physically are distributed radially or horizontally (rather than being confined to a discrete radius) so that their radial location is diffused accordingly. This is particularly true of the horizontal "pancake" configuration. Thus, the ability to change the radial distribution of plasma ion distribution by changing the relative apportionment of applied RF power between the inner and outer antennas is limited. This problem is particularly significant in processing semiconductor wafers with larger diameters (e.g., 300 mm). This is because as the wafer size increases, it becomes more difficult to maintain a uniform plasma ion density across the entire wafer surface. The radial distribution of plasma ion density can be readily sculpted by adjusting the radial distribution of the applied magnetic field from the overhead antenna. It is this field which determines plasma ion density. Therefore, as wafer size increases, a greater ability to sculpt or adjust the radial distribution of the applied RF field is required. Accordingly, it would be desirable to enhance the effect of the apportionment of applied RF power between the inner and outer antennas, and in particular to accomplish this by confining each of the inner and outer antennas to discrete or very narrow radial locations.

BRIEF DESCRIPTION OF THE DRAWINGS

The present invention is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

A method and apparatus for processing a substrate is described. An inductively-coupled plasma processing reactor has an inner coil antenna and outer coil antenna placed adjacent to a ceiling of the chamber. A single power source has dual differentially adjustable outputs connected respectively to the inner and outer coil antennas. The diameter of the outer coil antenna and the gap distance between a substrate support in the chamber and the ceiling of the chamber are adjusted so as to reduce the "M shape" etch rate profile in the inductively-coupled reactor.

Figure 1:
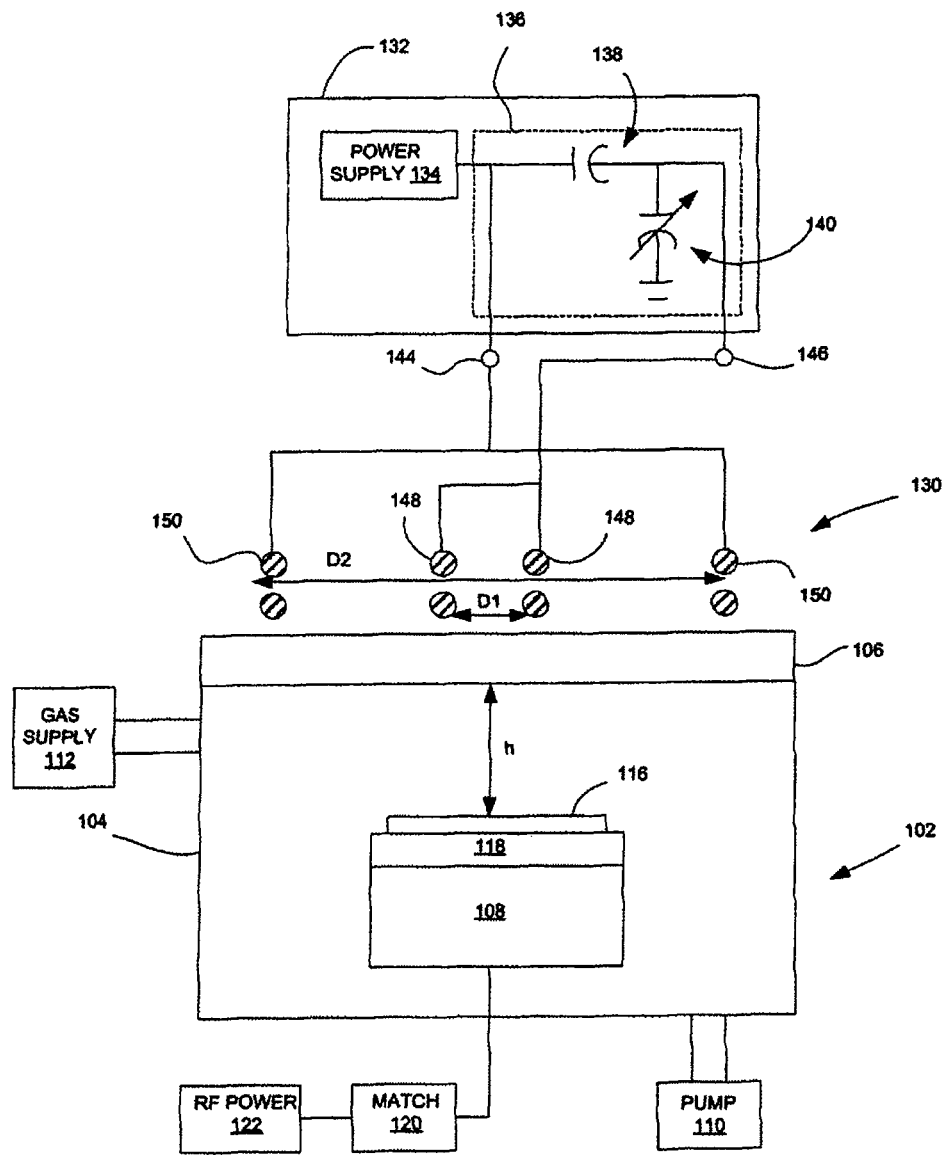
FIG. 1 is a block diagram illustrating an inductively-coupled plasma reactor with a single power source having dual differentially adjustable outputs connected respectively to the inner and outer coil antennas in accordance with one embodiment.

FIG. 1 is a block diagram of an inductively-coupled plasma reactor in accordance with one embodiment. A reactor chamber 102 is defined by a cylindrical side wall 104 and a flat ceiling 106. A substrate support 108 may be provided within the reactor chamber 102, oriented in facing relationship to the chamber ceiling and centered on the chamber axis of symmetry. The substrate support 108 may be positioned under the ceiling 124 at a distance h.

A vacuum pump 110 cooperates with an exhaust outlet (not shown) of the chamber 102. A process gas supply 112 furnishes process gas into the interior of the chamber 102 through a gas inlet 114. Those of ordinary skills in the art will recognize that the process gas may include different components, for example, a halide gas for polysilicon etching, a fluorocarbon gas for silicon dioxide etching, or silane gas for a silicon chemical vapor deposition process, a chlorine-bearing gas for metal etching. The gas inlet 114 is illustrated in FIG. 1 as a single pipe but in practical application may be implemented through more elaborate structures such as multiple inlets.

Under the influence of RF power induced into the chamber 102 from an antenna 130, such gases will support a plasma for processing the substrate 116. Plasma processes which may be performed can include not only etch, but also deposition such as chemical vapor deposition, with the use of suitable precursor gases.

The pedestal 108 may include a conductive electrode 118 coupled through an impedance match network 120 to a bias RF power source 122. The chamber side wall 104 may be a metal such as aluminum while the ceiling 106 may be a dielectric such as quartz. In other embodiments of the invention, the ceiling 106 may not be flat but may be dome shaped or conical.

In accordance with another embodiment, the ceiling 106 may be a semiconductor rather than a dielectric. The semiconductive material of the ceiling 124 may be of an optimum conductivity which enables it to act as a window to the RF inductive field from the antenna 130 as well as an electrode. In the case where the ceiling 106 may be employed as an electrode, it may be grounded (not shown) or may be connected through a match network (not shown) to an RF power source (not shown). The chamber 102 and/or antenna 130 may have a shape other than cylindrical (for example, rectangular with a square cross-section). The substrate 116 also may be other than circular (for example, square or other outer shape). The substrate 116 may include a semiconductor wafer, or other items such as a mask reticle.

As illustrated in FIG. 1, the antenna 130 may include a first antenna 148, and a second antenna 150, both adjacent and overlaying the ceiling 106 of the chamber 102. In accordance with one embodiment, the first antenna 148 may be concentric with the second antenna 150. The first antenna 148 may be an inner coil antenna having the same axis as the chamber 102. The second antenna 150 may be an outer coil antenna having the same axis as the chamber 102. The outer coil antenna 150 may thus have a diameter D2 greater than the diameter D1 of the inner coil antenna 148 as illustrated in FIG. 1.

An RF power source assembly 132 may include one RF generator 134 connected through an impedance match network 136. In accordance with one embodiment, the impedance match network 136 includes a series capacitor 138 and a variable shunt capacitor 140. Those of ordinary skills in the art will recognize that the impedance match network 126 is not limited to the circuit illustrated in FIG. 1. Other circuits achieving a similar effect of generating two different power levels from a single power source with a single frequency.

The impedance match network 136 may include a first RF output terminal 144 and a second RF output terminal 146. The first RF output terminal 144 may be connected at the input of series capacitor 138. The second RF output terminal 146 may be connected to the output of the series capacitor 138. Those of ordinary skills in the art will recognize the illustrated circuit of the match network 136 in FIG. 1 is not a complete circuit of a match network. It is shown only for illustration purposes. Adjusting the variable shunt capacitor 140 apportions more power to one output terminal or the other, depending upon the adjustment. Thus, the power levels at the two output terminals 144, 146 are differentially adjustable.

The first output terminal 144 may be connected to the outer antenna 150 while the second output terminal 146 may be connected to the inner antenna 148. Thus, terminals 144, 146 are connected respectively to the inner and outer antennas 150, 148. The dual output power source assembly 132 may be used with any plasma reactor having an inner and outer antenna.

Several factors may affect the etch rate profile of the substrate 116. Among those factors are the diameter D1 of the inner coil antenna 148, the diameter D2 of the outer coil antenna 150, and the gap h between the substrate 116/substrate support 118 and the ceiling 106 of the chamber 102. By adjusting the diameter D1, the diameter D2 and/or the gap h, the "M" shaped etch rate profile of the substrate 116 may be eliminated or substantially diminished. In accordance with one embodiment, the diameter D2 and the chamber gap h are modified/adjusted to bring improvement to the etch rate profile of the substrate.

Figure 2:
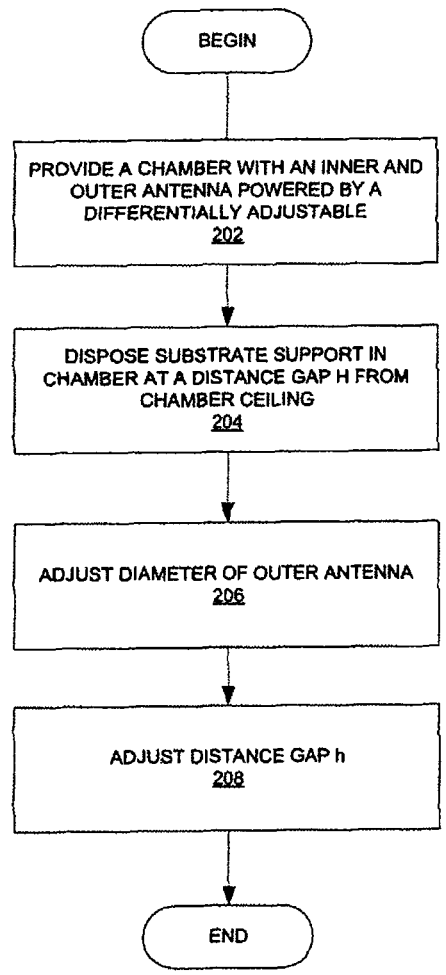
FIG. 2 is a flow diagram illustrating a method for improving etch rate uniformity in the reactor of FIG. 1 in accordance with one embodiment.

FIG. 2 is a flow diagram illustrating a method for improving etch rate uniformity in the reactor of FIG. 1 while eliminating the "M" shaped etch rate profile of the substrate 116. At 202, an inductively-coupled plasma reactor chamber is provided. The chamber has an inner and an outer antenna, both powered by one differentially adjustable power supply as illustrated in FIG. 1. At 204, a substrate support is disposed in the chamber at a chamber gap h from a ceiling of the chamber.

At 206, the diameter of the outer antenna is adjusted to increase uniformity of the etch rate profile of a substrate disposed on the substrate support in the chamber. In accordance with one embodiment, the diameter of the outer antenna is increased, for example, from 15" to 17".

At 208, the chamber gap h is adjusted to increase uniformity of the etch rate profile of the substrate. In accordance with one embodiment, the chamber gap h is increased from 5" to 6".

In accordance with another embodiment, the diameter and the chamber gap h are adjusted and balanced so that the etch rate profile of the substrate is substantially uniform, substantially eliminating an "M shape" etch rate profile.

Figure 3:
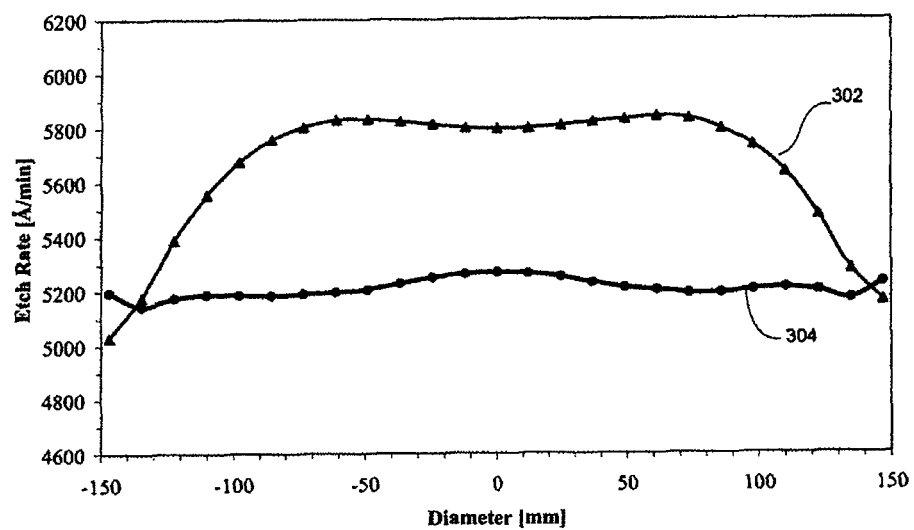
FIG. 3 is a graph illustrating etch rates of a conventional reactor and a reactor in accordance with one embodiment.

FIG. 3 is a graph illustrating a comparison of etch rate profiles from a conventional reactor and from a reactor in accordance with one embodiment. Etch rate profile 302 is a result of a conventional inductively-coupled chamber having an outer coil antenna diameter of 15" and a 5" chamber gap. Etch rate profile 304 is a result of an inductively-coupled chamber in accordance with one embodiment. For illustration purposes, one embodiment of the inductively-coupled chamber may have a chamber gap of 6" and an outer coil antenna diameter of 17". As illustrated in FIG. 3, the etch rate profile is substantially uniform throughout the surface of the substrate. The previous M shape is substantially eliminated.

Figure 4:
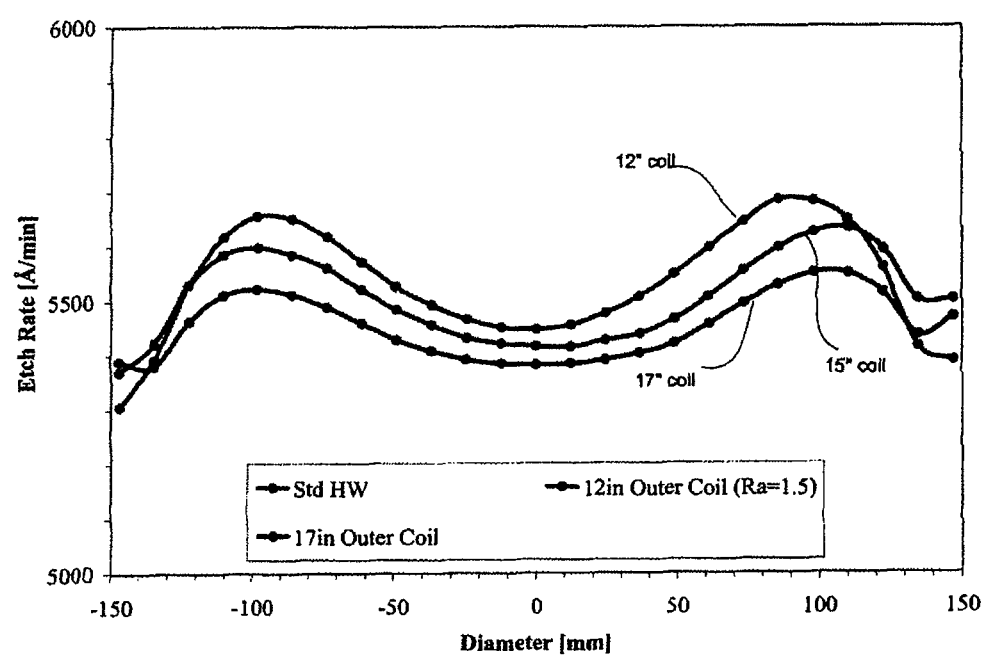
FIG. 4 is a graph illustrating etch rates of different coil diameters in accordance with one embodiment.

FIG. 4 illustrates different etch rate profiles based on different diameters D2 with a constant 5" chamber gap h. A change in the diameter D2 of the outer coil antenna 150 affects the M shape peak position. When the chamber gap h is small, the effect of the diameter D2 of the outer coil antenna 150 becomes significant due to short diffusion horizontal length caused by limited vertical chamber height. The M-shape peaks moves towards the edge of the substrate with increasing diameter D2, increasing the etch rate at the edges of the substrate 116 and improving the etch rate uniformity.

Figure 5:
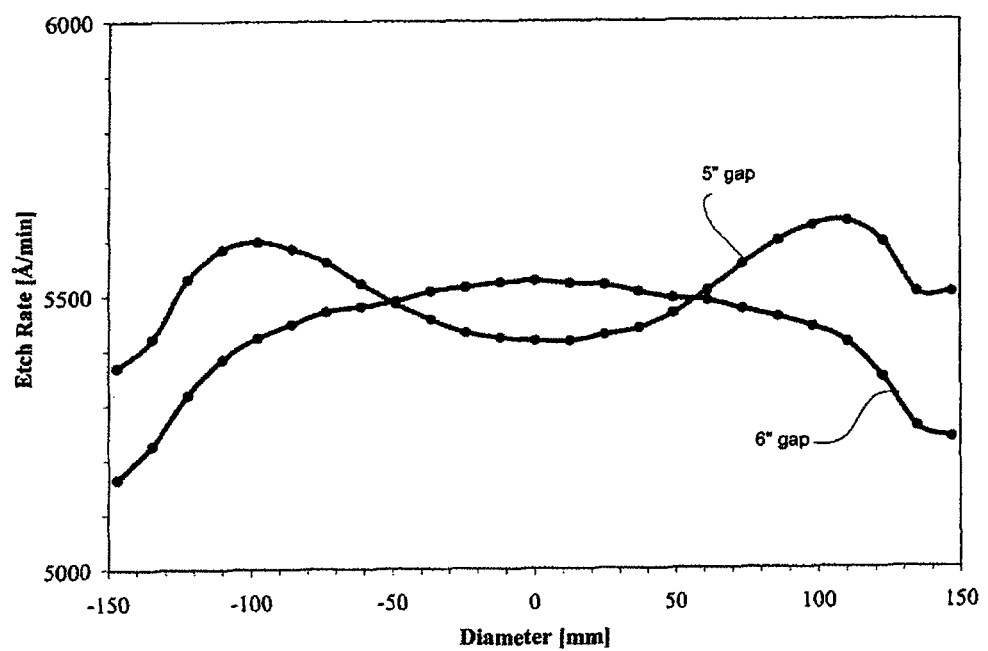
FIG. 5 is a graph illustrating etch rates of a 5" gap chamber and a 6" gap chamber in accordance with one embodiment.

FIG. 5 illustrates different etch rate profiles based on different chamber gaps h (5" and 6") with a constant outer coil antenna diameter D2 of 15". A change in the gap h gives the plasma more space/chance to diffuse horizontally. Therefore, the M-shape peaks moves towards the center with increasing chamber gap h to finally merge and form a single peak at the center. On the other hand, there is more chance for surface recombination loss at the chamber walls 104 due to longer diffusion length. Etch rate at the edges decreases quickly.

Figure 6:
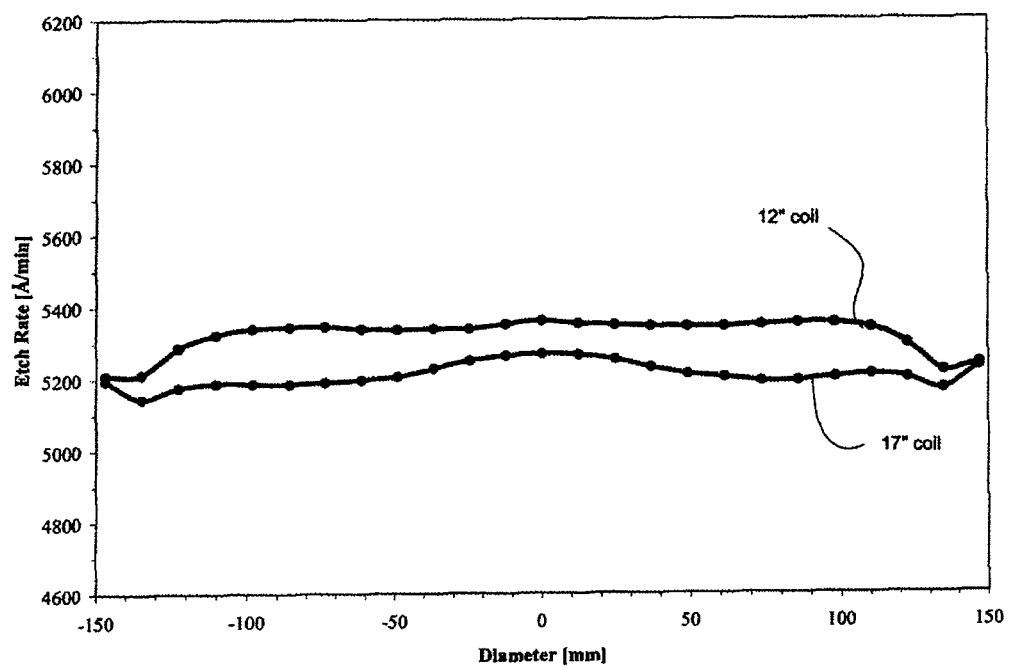
FIG. 6 is a graph illustrating etch rates of a 12" coil diameter and a 17" coil diameter with a 6" gap chamber in accordance with one embodiment.

FIG. 6 is a graph illustrating etch rate profiles of a 12" coil diameter and a 17" coil diameter with a 6" chamber gap in accordance with one embodiment. With a 12" outer coil diameter, etch rate at the edges of the substrate does not seem to increase. However, with a 17" outer coil diameter, etch rate is comparable to that at the center of the substrate.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An inductively coupled plasma reactor for processing a 300 mm substrate comprising:
    a chamber having a ceiling;
    a first outer antenna having a first solenoid coil and a second inner antenna having a second solenoid coil adjacent to the ceiling wherein the first outer antenna and the second inner antenna are physically separated from each other, the first outer antenna is concentric with the second inner antenna, and said first solenoid coil has a diameter of at least 17";
    a plasma source power supply coupled to the first and second antenna; and
    a substrate support disposed within the chamber a distance of at least 6" from said ceiling, wherein a size of the first outer antenna and a distance between the substrate support and the ceiling are such that an etch rate of the 300 mm substrate on the substrate support is substantially uniform without an M shape profile.

2. The apparatus of claim 1 wherein the diameter of the first solenoid coil is greater than the diameter of the second solenoid coil.

3. The apparatus of claim 1 wherein the etch rate of an inner region of the substrate is substantially dependent on the size of the first outer antenna.

4. The apparatus of claim 1 wherein the etch rate of an outer region of the substrate is substantially dependent on the distance between the substrate support and the ceiling.

5. The apparatus of claim 1 wherein the plasma source power supply further comprises:
    a RF power supply; and
    an impedance match network coupled to the RF power supply, wherein the impedance match network comprises a first and a second RF output having differentially adjustable power levels, the first RF output connected to the first outer antenna, the second RF output connected to the second inner antenna.

6. The apparatus of claim 5 wherein the impedance match network generates a first RF power level to the first outer antenna, and a RF second power level to the second inner antenna, wherein respective RF power levels applied to the first outer antenna and the second inner antenna are differentially adjustable to control radial distribution of an applied RF field from the first outer antenna and the second inner antenna.

7. An inductively-coupled plasma processing chamber comprising:
    a chamber having a ceiling;
    a first and second antenna adjacent to the ceiling, the first antenna concentric to the second antenna, wherein the first antenna and the second antenna are physically separated from each other;
    a substrate support disposed in the chamber for supporting a 300 mm substrate;
    means for supplying a first RF power to said first antenna and a second RF power to said second antenna; and
    wherein the ceiling is separated from said substrate support by a distance and wherein said distance is adjustable, wherein the first antenna includes a first solenoid coil having a modifiable diameter, and the second antenna includes a second solenoid coil, the modifiable diameter of the first solenoid coil is greater than a diameter of the second solenoid coil, the modifiable diameter of the first solenoid coil is at least 17", and wherein the distance between the substrate support and the ceiling is at least 6", and the etch rate of a 300 mm wafer on the substrate support is uniform without an M shaped profile.

\* \* \* \* \*